United States Patent
Barrows et al.

(10) Patent No.: US 8,020,137 B2
(45) Date of Patent: *Sep. 13, 2011

(54) STRUCTURE FOR AN ON-DEMAND POWER SUPPLY CURRENT MODIFICATION SYSTEM FOR AN INTEGRATED CIRCUIT

(75) Inventors: Corey K. Barrows, Colchester, VT (US); Kenneth J. Goodnow, Essex Junction, VT (US); Stephen G. Shuma, Underhill, VT (US); Peter A. Twombly, Shelburne, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 686 days.

This patent is subject to a terminal disclaimer.

(21) Appl. No.: 11/957,626

(22) Filed: Dec. 17, 2007

(65) Prior Publication Data

US 2009/0152591 A1 Jun. 18, 2009

(51) Int. Cl.
*G06F 17/50* (2006.01)
(52) U.S. Cl. .......................... 716/133; 257/203
(58) Field of Classification Search ............. 716/12–14, 716/104, 126, 133; 257/203, 207
See application file for complete search history.

(56) References Cited

U.S. PATENT DOCUMENTS

| 6,393,547 | B1 | 5/2002 | Mason |
| 7,313,707 | B2 | 12/2007 | Shaver et al. |
| 7,378,735 | B2 | 5/2008 | Lin |
| 2002/0196672 | A1* | 12/2002 | Honma et al. .......... 365/189.11 |
| 2008/0052505 | A1 | 2/2008 | Theobald |
| 2009/0141579 | A1* | 6/2009 | Tao et al. .......... 365/226 |
| 2009/0152591 | A1* | 6/2009 | Barrows et al. .......... 257/203 |

FOREIGN PATENT DOCUMENTS

WO 2006015633 2/2006

OTHER PUBLICATIONS

Office Action dated Mar. 16, 2010 in related U.S. Appl. No. 11/954,600.
Election/Restriction Requirement dated Jan. 19, 2010 in related U.S. Appl. No. 11/954,600.
Response to Election/Restriction Requirement dated Jan. 27, 2010 in related U.S. Appl. No. 11/954,600.
U.S. Appl. No. 11/954,600, filed Dec. 12, 2007, entitled On-Demand Power Supply Current Modification System and Method for an Integrated Circuit, Corey K. Barrows, Kenneth J. Goodnow, Stephen G. Shuma, Peter A. Twombly, and Paul S. Zuchowski.

(Continued)

*Primary Examiner* — Vuthe Siek
(74) *Attorney, Agent, or Firm* — Downs Rachlin Martin PLLC

(57) ABSTRACT

A design structure for a circuit that selectively connects an integrated circuit to elements external to the integrated circuits. The circuit includes and input/output element that selectively connects an input/output pin as a function of a power requirement or a signal bandwidth requirement of the integrated circuit. The input/output element includes one or more switching devices that connect the input/output pin to an external element, such as a power supply or external signal path. The input/output element also includes one or more switching devices that connect the input/output pin to an internal element, such as a power network or internal signal line.

6 Claims, 5 Drawing Sheets

OTHER PUBLICATIONS

Response to Office Action dated Jun. 16, 2010 in related U.S. Appl. No. 11/954,600.
Final Office Action dated Aug. 25, 2010 in related U.S. Appl. No. 11/954,600.
Response to Final Office Action dated Oct. 25, 2010, in related U.S. Appl. No. 11/954,600, filed Dec. 12, 2007, Barrows et al.
Advisory Action dated Nov. 3, 2010, in related U.S. Appl. No. 11/954,600, filed Dec. 12, 2007, Barrows et al.
RCE dated Dec. 22, 2010, in related U.S. Appl. No. 11/954,600, filed Dec. 12, 2007, Barrows et al.
Office Action dated Mar. 11, 2011, in related U.S. Appl. No. 11/954,600, filed Dec. 12, 2007, Corey K. Barrows et al.

* cited by examiner

US 8,020,137 B2

STRUCTURE FOR AN ON-DEMAND POWER SUPPLY CURRENT MODIFICATION SYSTEM FOR AN INTEGRATED CIRCUIT

FIELD OF THE INVENTION

The present invention generally relates to the field of integrated circuits. In particular, the present invention is directed to a design structure for an on-demand power supply current modification system for an integrated circuit.

BACKGROUND

Advancements in technology and manufacturing capabilities change the operational characteristics of a semiconductor device. While these changes include improvements in overall performance and processing capabilities, they also include corresponding increases in, e.g., power density requirements. Unfortunately, changes in the power density of a semiconductor device oftentimes increase faster than the structural changes to the device necessary to meet the increased power needs. Indeed, physical constraints to the overall device may limit these structural changes. In one example, although certain improvements to a semiconductor device may include an increase in power density, its ability to meet the increased power requirements is limited by its input/output capabilities.

SUMMARY OF THE DISCLOSURE

One implementation of the present invention is a design structure embodied in a machine readable medium used in a design process for a circuit for selectively connecting an integrated circuit to a plurality of external paths, the plurality of external paths including a first signal path and an external power supply. The circuit includes a second signal path internal to the integrated circuit; a power network internal to the integrated circuit; and an input/output element configured to switch amongst a plurality of modes including a first mode and a second mode, the first mode connecting the first signal path to the second signal path via the input/output element, the second mode connecting the power network to the external power supply via the input/output element.

Another implementation of the present invention is a design structure embodied in a machine readable medium for a circuit for selectively connecting one or more external paths with an integrated circuit, the one or more external paths including a first signal path. The design structure of the circuit includes a second signal path internal to the integrated circuit; a power network internal to the integrated circuit; a first means for switching amongst a plurality of inputs including the second signal path and the power network; a second means in electrical communication with the first means, the second means for switching amongst a plurality of external paths including the first signal path and the power supply, wherein when the first means is connected to the second signal path, the second means is connected to the first signal path such that the second signal path and the first signal path are in electrical communication, and when the first means is connected to the power network, the second means is connected to the external power supply such that the power network and the power supply are in electrical communication.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
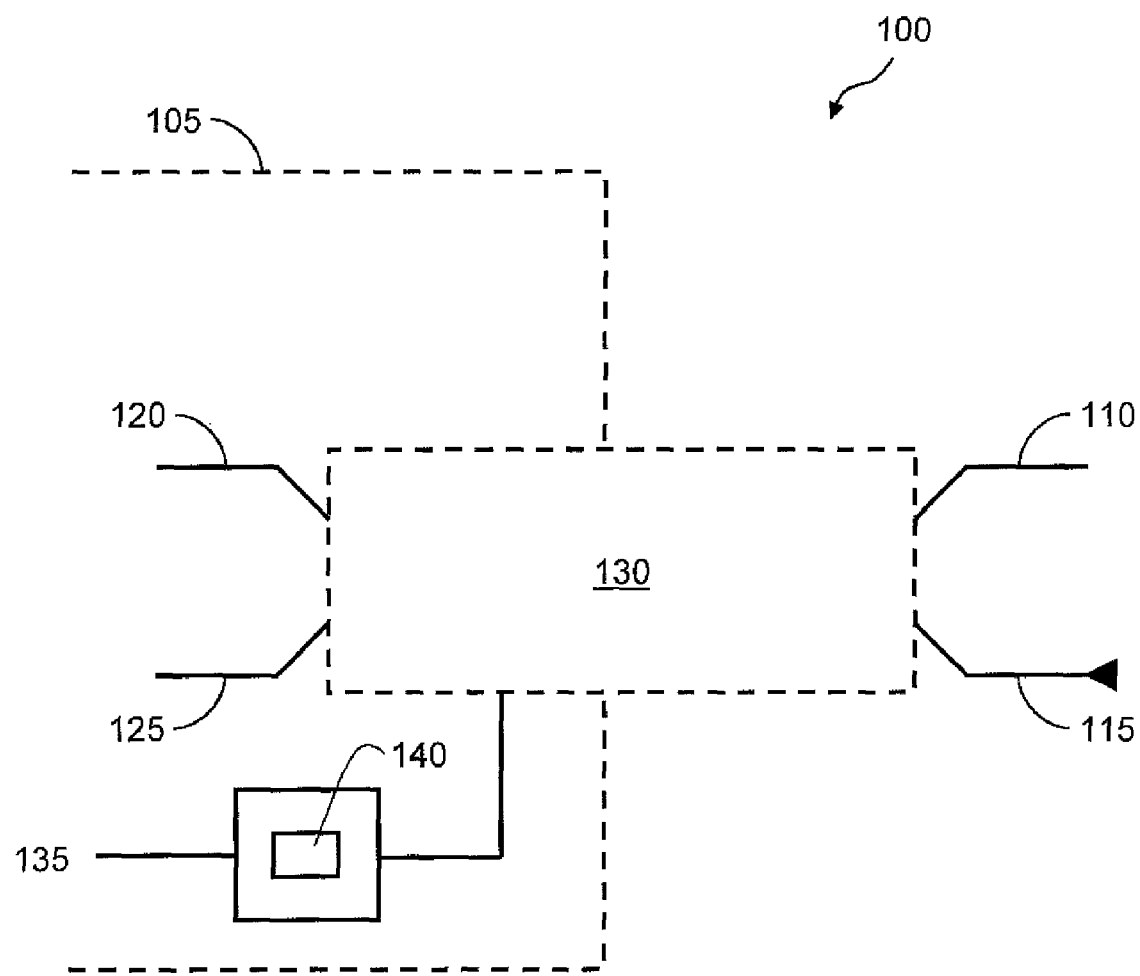
FIG. 1 is a schematic diagram of one embodiment of a circuit for connecting elements internal to an integrated circuit with elements external to the integrated circuit.

The present invention is directed to a design structure for an on-demand power supply current modification system for an integrated circuit. FIG. 1 illustrates one embodiment of a system 100 for selectively connecting integrated circuit 105 to elements external to the integrated circuit. These external elements include, but are not limited to, a signal path, a power supply, a test device, and any combinations thereof. In the present example, the external elements include an external signal path 110 and an external power supply 115.

Integrated circuit 105 may be an electronic circuit, or combination of electronic circuits, that perform functions important to electronic design. Examples of an integrated circuit (e.g., integrated circuit 105) include, but are not limited to, a micro-processor, a micro-controller, an application specific integrated circuit (ASIC), an application specific standard product (ASSP), a customer specific standard product (CSSP), a mixed signal IP, and any combinations thereof. In the present example, integrated circuit 105 is an integrated circuit chip having internal elements that require communication to and from external elements, such as those external elements discussed above. Examples of an internal element include, but are not limited to, a signal path, a power network, and any combination thereof. Here, these internal components include an internal signal path 120 and an internal power network 125. An internal signal path (e.g., internal signal path 120) may be any path that electrically communicates one or more data elements as is known by those of ordinary skill. A power network (e.g., power network 125) distributes power to portions of integrated circuit 105.

System 100 also includes an input/output element 130. An input/output element 130 provides selective electrical connection between the elements internal to integrated circuit 105 and the elements external to integrated circuit 105. In one example, input/output element 130 provides this selective connection by switching between a plurality of modes. In one mode, input/output element 130 electrically connects external signal path 110 with internal signal path 120. In another mode, input/output element 130 electrically connects power supply 115 with power network 125.

System 100 further includes a controller 135 that communicates with input/output element 130. Controller 135 controls the switching of input/output element 130, such as, for example, by switching input/output element 130 from one mode to another mode. In this example, controller 135 may be associated with an optional algorithm 140 that instructs the switching of input/output element 130. Algorithm 140 may include a set of instructions that control the switching input/ output element 130, as described in more detail below. In one example, controller 135 may be hardware based on executing logic for controlling input/output element 130.

Examples of a controller include, but are not limited to, a processor, a flip-flop state machine with control logic, and any combination thereof. In the present example, controller 135 is positioned on or within integrated circuit 105. It is contemplated, however, that alternative configurations of controller 135 may provide that it be located external to integrated circuit 105. In still other configurations of system 100, controller 135 can be incorporated within input/output element 130, such as, for example, within the circuit structure of input/output element 130.

Figure 2:
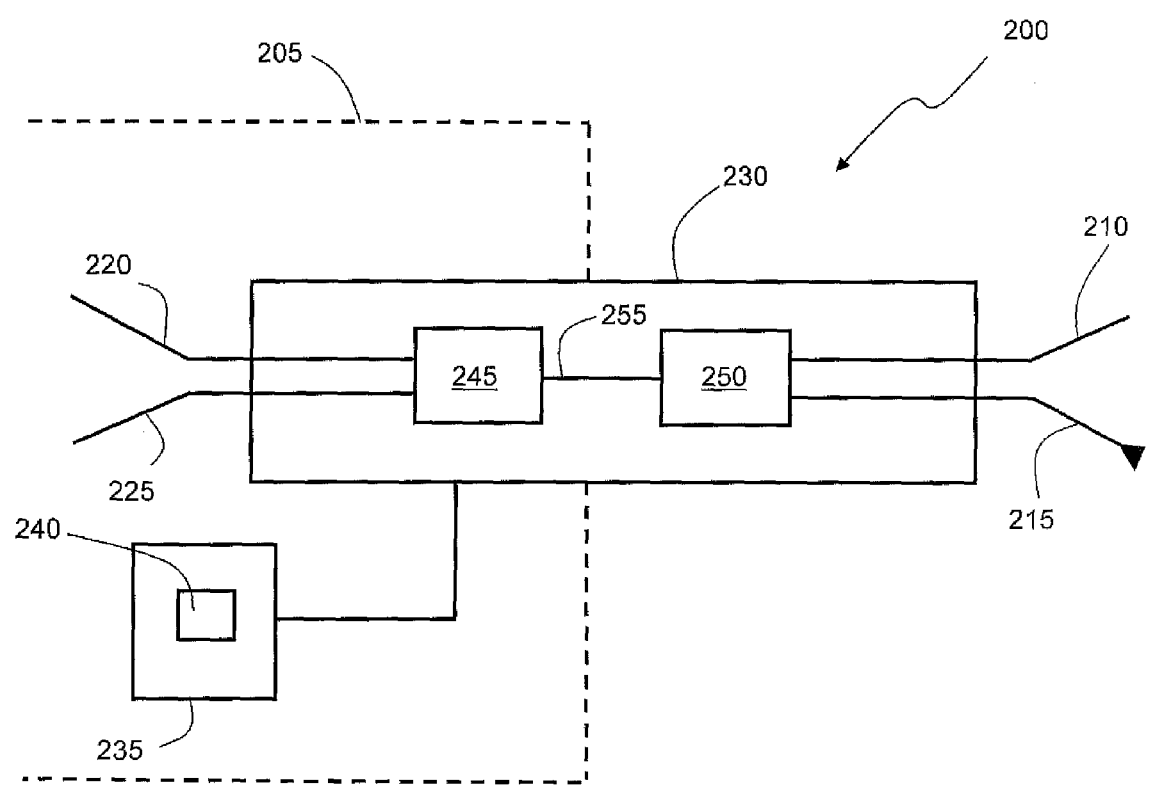
FIG. 2 is a schematic diagram of another embodiment of a circuit for connecting elements internal to an integrated circuit with elements external to the integrated circuit.

FIG. 2 illustrates another embodiment of a system 200 for selectively connecting external elements (an external signal path 210 and a power network 215) to internal elements (internal signal path 220 and power network 225). The internal and external elements are connected to an input/output element 230 that is controlled via a controller 235 and an optional algorithm 240. In the present example, input/output element 230 includes a switching device 245 and a switching device 250. A switching device (e.g., switching devices 245, 250) may be any electronic device that can selectively switch between one or more inputs and/or one or more outputs. Examples of a switching device include, but are not limited to, a pass gate multiplexer, a relay, a switching circuit, and any combinations thereof.

Input/output element 230 also includes an electrically conductive wire 255 that can be connected to the internal and external elements via switching device 245 and switching device 250. In one example, wire 255 may be an input/output pin. The electrical connection of wire 255 can be changed by switching device 245 and switching device 250. In one aspect, switching device 245 is configured to switch electrical connection of wire 255 between signal path 220 and power network 225. In another aspect, switching device 250 is configured to switch electrical connection of wire 255 between signal path 210 and power supply 215.

In one implementation of an on-demand system and method, the electrical connection of wire 255 with the various internal and external elements can vary as a function of the operating condition of integrated circuit 205. A variety of operating conditions may influence the operating mode of input/output element 230. Examples of an operating condition include, but are not limited to, a high-power condition, a low-power condition, a high signal connectivity condition, a low signal connectivity condition, and any combinations thereof. In one example, as integrated circuit 205 requires less power and/or signal throughput, input/output element 230 (e.g., with instructions from controller 235) may switch to a first operating mode.

Input/output element 230 may selectively switch between a plurality of operating modes In one mode, switching device 245 electrically connects to internal signal path 220 and switching device 250 electrically connects to external signal path 210, thereby electrically connecting internal signal path 220 and external signal path 210 via wire 255. In another mode, switching device 245 electrically connects to power network 225 and switching device 250 electrically connects to power supply 215, thereby electrically connecting power network 225 and external power supply 215 via wire 255.

Figure 3:
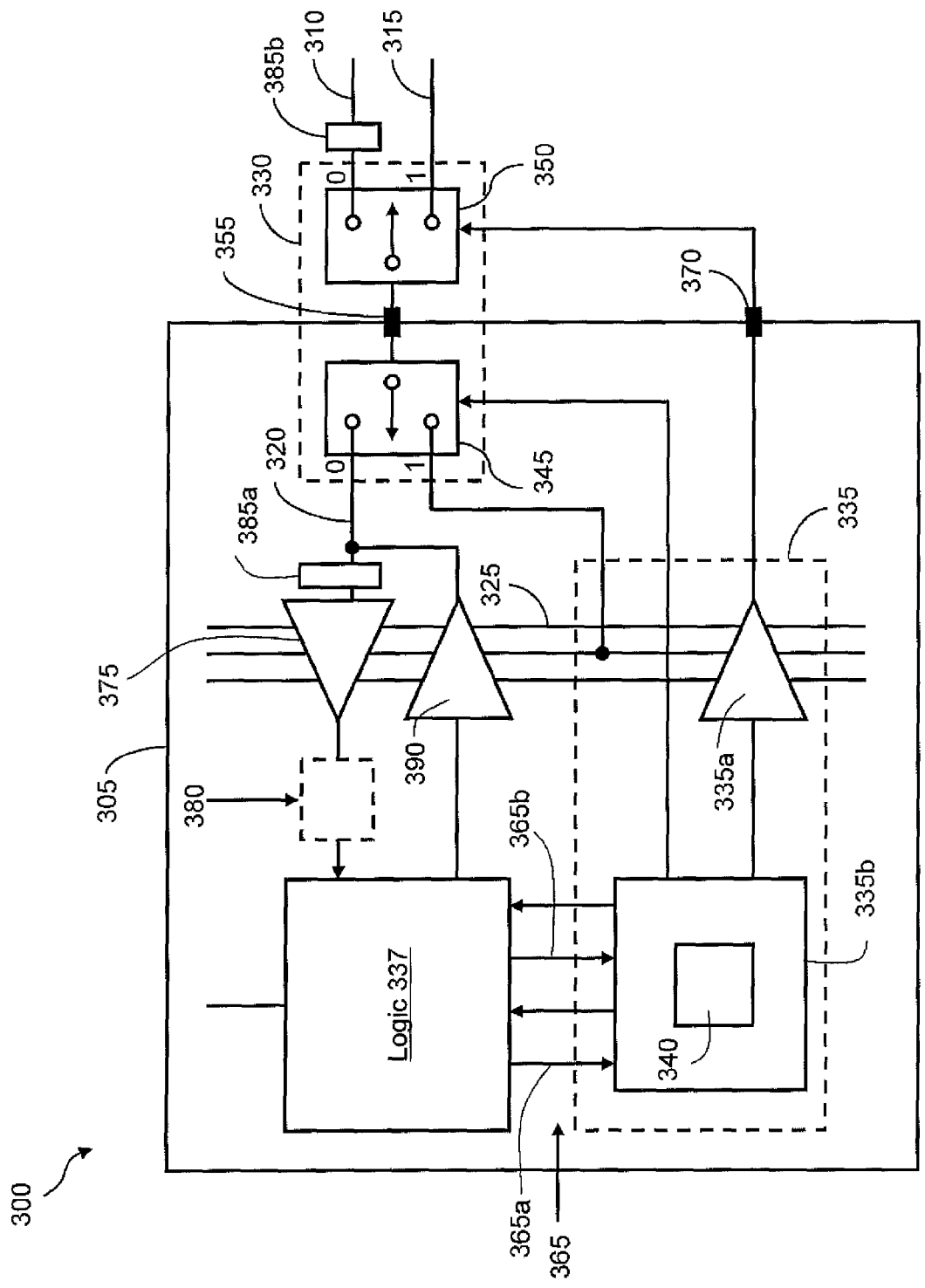
FIG. 3 is a schematic diagram of yet another embodiment of a circuit for connecting elements internal to an integrated circuit with elements external to the integrated circuit.

FIG. 3 illustrates yet another embodiment of a system 300 for selectively connecting the internal and external elements of an integrated circuit 305. In this example, system 300 connects external elements (an external signal path 310 and a power supply 315), with internal elements (an internal signal path 320 and a power network 325). The connection occurs via an input/output element 330 that is connected to a controller 335, optionally having an algorithm 340. Input/output element 330 includes a switching device 345 and a switching device 350 that switch the connection of an input/output pin 355 with the internal and external elements.

Controller 335 includes electrical devices that allow controller 335 to switch switching devices 345, 350. In one example, controller 335 includes a control I/O 335a and I/O arbiter 335b. Those of ordinary skill will be readily familiar with these devices, as well as other devices, designs and configurations in connection with controller 335 such that they need not be described in any detail herein, other than to the extent necessary to describe how features of the present disclosure may be implemented. Control I/O 335a and I/O arbiter 335b electrically communicate with switching devices 345, 350, respectively. A plurality of switching devices can be arranged in a manner so as to allow controller 335 (e.g., through control I/O 335a and I/O arbiter 335b or other electrical configuration) to control all of the switching devices. In the present example, a single input/output pin 370 is used to control switching device 350. In other examples, multiple pins may be utilized to transfer one or more control signals to one or more switching elements, such as switching element 350. Although only a single pair of switching devices 350,355 is illustrated, it is contemplated that other embodiments of system 300 can include a plurality of pairs of switching devices that are arranged to electrically communicate in a serial relationship, such that a single input/output pin can be used to control the series of switching devices.

In this embodiment, system 300 varies the connection of input/output pin 355 with the internal and external elements in accordance with the functional requirements of integrated circuit 305. As illustrated in FIG. 3, controller 335 communicates with a logic element 337 of integrated circuit 305 and controls switching devices 340, 345 in response to power supply requirement 365. A power supply requirement (e.g., power supply requirement 365) provides information or instructions to controller 335 about the functional requirements of integrated circuit 305. These functional requirements can include, for example, a requirement for additional input/output pins to provide increased power and/or a requirement for additional input/output pins to transmit signals between the internal and the external elements. Examples of a power supply requirement include, but are not limited to, a power requirement 365a, a signal bandwidth requirement 365b, and any combination thereof.

Controller 335 responds to one or more of input requirements 365 by switching input/output element 330. In one example, controller 335 responds to power requirement 365a by switching input/output element 330 into a power mode. A power mode allows the transmission of a power signal from the external elements, via input/output pin 355, to the internal elements. In a power mode, controller 335 connects switching device 350 with power supply 315 and connects switching device 345 with power supply 325. In another example, controller 335 responds to signal bandwidth requirement 365b by switching input/output element 330 into a signal mode. A signal mode allows the bi-directional transmission of a data signal, via input/output pin 355, between external elements and the internal elements. In a signal mode, controller 335 connects switching device 350 with signal path 310 and connects switching device 345 with signal path 320.

As discussed above, controller 335 can be associated with an algorithm 340 that provides instructions for determining the switching of switching devices 345, 350. In one example, algorithm 340 includes a set of instructions having pre-determined information describing the power requirements and/or the signal bandwidth requirements of integrated circuit chip 305. In another example, algorithm 340 includes a set of instructions for determining power requirement 365a and signal bandwidth requirement 365b from input requirement 365 provided by integrated circuit chip 205. In still another example, algorithm 340 includes a set of instructions for responding to power requirement 365a and signal bandwidth requirement 365b received from integrated circuit chip 305.

Figure 4:
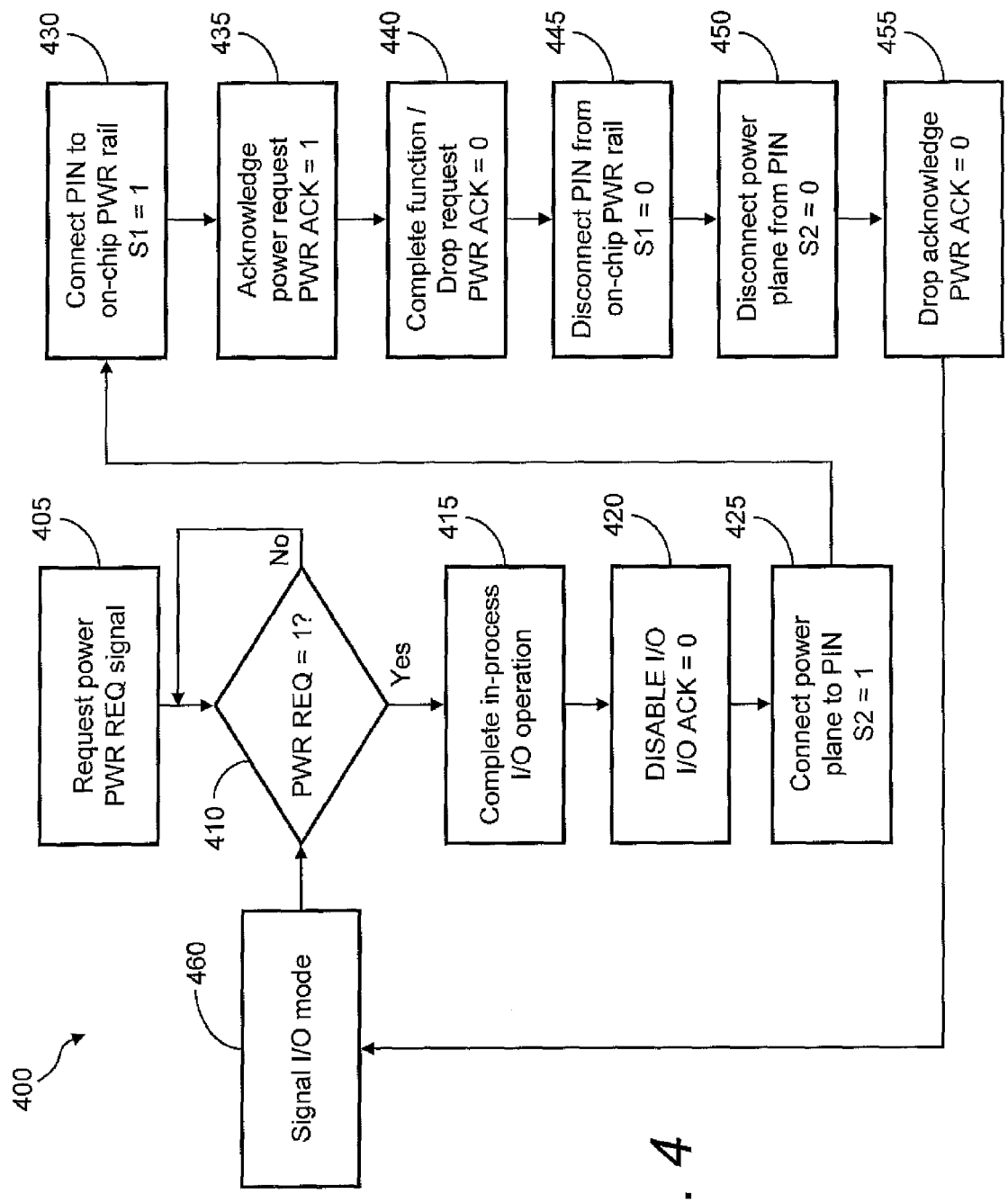
FIG. 4 is a flow diagram of an optional algorithm implemented in an embodiment of a circuit, such as the circuit illustrated in FIGS. 1, 2 and 3.

Referring next to FIG. 4, and also FIG. 3, an example 400 of an algorithm that responds to power requirement 365a and/or signal bandwidth requirement 365b is illustrated. In this example, algorithm 400 receives an input requirement 405 at Step 310. As discussed above, input requirement 405 prompts controller 335 to switch input/output element 330.

If, e.g., input requirement 365 is a power requirement 365a, algorithm 400 proceeds to Steps 415-460, which instruct controller 335 to switch input/output element 330 into a power mode. At step 415, algorithm 400 allows any input/output operation in progress at the time the power requirement is received to be completed. Then, at step 420, algorithm 400 instructs controller 335 (FIG. 3) to disable the input/output and signal this disablement to integrated circuit chip 305. Next, at steps 425 and 430, algorithm 400 instructs controller 335 to connect switching device 345 to power supply 315 and switching device 350 to power network 225. Then, at steps 435 and 440, algorithm 400 instructs controller 335 to acknowledge the power requirement by signaling to integrated circuit chip 305 and waiting for the completion of the necessary function, as signaled by the power requirement 365a. Finally, at steps 445, 450, 455, and 460, algorithm 400 instructs controller to connect switching device 345 to signal path 310, connect switching device 350 to internal signal path 320 and remove the power requirement acknowledgement.

Referring back to FIG. 3, an optional implementation of system 300 also includes an optional receiver 375 that may be used in a receiver implementation, discussed in more detail below. A receiver (e.g., receiver 375) is known in the art. In addition to receiver 375, system 300 may include other optional electrical components. The present example, for instance, includes a flush latch 380 that electrically communicates with receiver 375, as illustrated in FIG. 3. Examples of a flush latch include, without limitation, any memory element that can be configured to hold its existing state in one mode, or pass an input state directly to its outputs in a flush mode. This example also includes optional resistors 385a, 385b. Examples of resistors include, without limitation, a pull-up resistor, a pull-down resistor, and any resistor or other device that functions so as to hold a node at a specific level. It can be appreciated that these components are recognized in the art such that they need not be described in any detail herein.

In a receiver implementation, system 300 may operate in a signal mode or a power mode. In a signal mode, system 300 switches switching device 345 to electrically connect with receiver 370. Switching device 350 is switched to electrically connect with signal path 310. Flush latch 380 is maintained in a flush state. In a power mode, system 300 switches switching device 345 to electrically connect with power network 325. Switching device 350 is switched to electrically connect with power supply 315. The value at the input to receiver 375 is set to known signal level (e.g., a voltage level) using resistor 385a. Flush latch 380 is maintained in a retain state.

Another optional implementation of system 300 includes an optional transmitter 390 that may be used in a transmitter implementation, discussed more below. A transmitter (e.g., transmitter 390) is an input/output driver, or any other IC driver circuit known in the art. In a transmitter implementation, system 300 may operate in a signal mode or a power mode. In a signal mode, system 300 switches switching device 345 to electrically connect with transmitter 390. Switching device 350 is switched to electrically connect with signal path 310. In a power mode, system 300 switches switching device 345 to electrically connect with power network 325. Switching device 350 is switched to electrically connect with power supply 315. Signal path 320 is modified to a known signal level (e.g., a voltage level) using resistor 385b. Flush latch 380 is maintained in a retain state.

Figure 5:
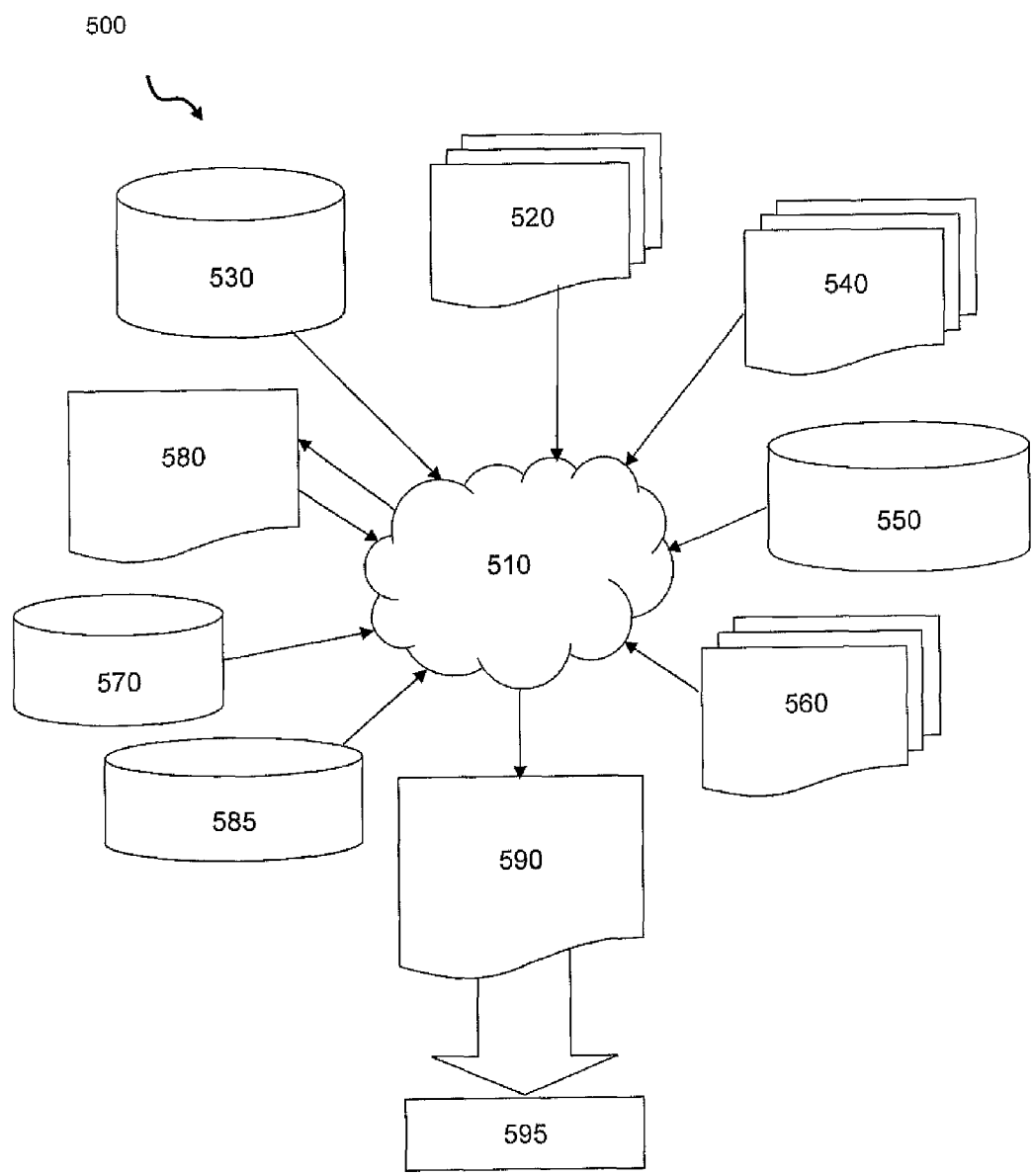
FIG. 5 is a flow diagram of a design process used in semiconductor design, manufacturing, and/or test

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 comprises system 100 in the form of schematics or HDL, a hardware-description language (e.g., Verilog, VHDL, C, etc.). Design structure 520 may be contained on one or more machine readable medium. For example, design structure 520 may be a text file or a graphical representation of system 100. Design process 510 preferably synthesizes (or translates) system 100 into a netlist 580, where netlist 580 is, for example, a list of wires, transistors, logic gates, control circuits, I/O, models, etc. that describes the connections to other elements and circuits in an integrated circuit design and recorded on at least one of machine readable medium. This may be an iterative process in which netlist 580 is resynthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 90 nm, etc.), design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Design process 510 preferably translates an embodiment of the invention as shown in FIGS. 1-3, along with any additional integrated circuit design or data (if applicable), into a second design structure 590. Design structure 590 resides on a storage medium in a data format used for the exchange of layout data of integrated circuits (e.g. information stored in a GDSII (GDS2), GL1, OASIS, or any other suitable format for storing such design structures). Design structure 590 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3. Design structure 590 may then proceed to a stage 595 where, for example, design structure 590: proceeds to tape-out, is released to manufacturing, is released to a mask house, is sent to another design house, is sent back to the customer, etc.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A machine readable, volatile or non-volatile memory medium, which is not a signal, containing a design structure in a data format, the design structure when processed by executing instructions on a machine is used in a design process for a circuit, the circuit for selectively connecting an integrated circuit to a plurality of external paths, the plurality of external paths including a first signal path and an external power supply, the circuit comprising:
   a second signal path internal to the integrated circuit;
   a power network internal to the integrated circuit; and
   an input/output element configured to switch amongst a plurality of modes including a first mode and a second mode, the first mode connecting the first signal path to said second signal path via said input/output element, the second mode connecting said power network to the external power supply via said input/output element.

2. A machine readable medium according to claim 1, wherein the design structure comprises a netlist, which describes the circuit.

3. A machine readable medium according to claim 1, wherein the design structure resides on storage medium as a data format used for the exchange of layout data of integrated circuits.

4. A machine readable medium according to claim 1, wherein the design structure includes at least one of test data files, characterization data, verification data, or design specifications.

5. A machine readable medium, which is not a signal, containing a design structure in a data format, the design structure when processed by executing instructions on a machine is used in a design process for a circuit, the circuit for selectively connecting one or more external paths with an integrated circuit, the one or more external paths including a first signal path, the design structure of the circuit comprising:
   a second signal path internal to the integrated circuit;
   a power network internal to the integrated circuit;
   a first means for switching amongst a plurality of inputs including said second signal path and said power network;
   a second means in electrical communication with said first means, said second means for switching amongst a plurality of external paths including the first signal path and the power supply, wherein when said first means is connected to said second signal path, said second means is connected to the first signal path such that said second signal path and the first signal path are in electrical communication via the first and second means, and when said first means is connected to said power network, said second means is connected to the external power supply such that said power network and the power supply are in electrical communication via the first means and second.

6. A machine readable medium according to claim 5, wherein the design structure further comprising a controller in communication with said first means and said second means, said controller configured to instruct said first means to switch amongst the plurality of inputs including said second signal path and said power network and to instruct said second means to switch amongst said plurality of inputs including the first signal path and the external power supply.

\* \* \* \* \*